United States Patent
Luo et al.

(10) Patent No.: US 10,381,360 B1
(45) Date of Patent: Aug. 13, 2019

(54) CONTROL GATE DUMMY FOR WORD LINE UNIFORMITY AND METHOD FOR PRODUCING THE SAME

(71) Applicant: GLOBALFOUNDRIES Singapore Pte. Ltd., Singapore (SG)

(72) Inventors: Laiqiang Luo, Singapore (SG); Sen Mei, Singapore (SG); Fangxin Deng, Singapore (SG); Zhiqiang Teo, Singapore (SG); Fan Zhang, Singapore (SG); Pinghui Li, Singapore (SG); Haiqing Zhou, Singapore (SG); Xingyu Chen, Singapore (SG); Kin Leong Pey, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/933,069

(22) Filed: Mar. 22, 2018

(51) Int. Cl.
| | |
|---|---|
| H01L 27/115 | (2017.01) |
| H01L 27/11546 | (2017.01) |
| H01L 27/11521 | (2017.01) |
| H01L 21/02 | (2006.01) |
| H01L 21/321 | (2006.01) |
| H01L 21/3213 | (2006.01) |
| H01L 21/265 | (2006.01) |
| H01L 29/423 | (2006.01) |

(52) U.S. Cl.
CPC .. *H01L 27/11546* (2013.01); *H01L 21/02236* (2013.01); *H01L 21/26513* (2013.01); *H01L 21/3212* (2013.01); *H01L 21/32137* (2013.01); *H01L 27/11521* (2013.01); *H01L 29/42328* (2013.01)

(58) Field of Classification Search
CPC ................................................. H01L 27/11546
See application file for complete search history.

(56) References Cited

U.S. PATENT DOCUMENTS 10,128,259 B1 * 11/2018 Yang ............... H01L 27/11568
2015/0087123 A1 3/2015 Wu et al.

\* cited by examiner

*Primary Examiner* — William Coleman
(74) *Attorney, Agent, or Firm* — Ditthavong & Steiner P. C.

(57) ABSTRACT

A method of forming a uniform WL over the MCEL region and resulting device are provided. Embodiments include providing a substrate having a MCEL region, a HV region and a logic region, separated by an isolation region; forming a plurality of CG stacks over the MCEL region, and a plurality of CG dummy stacks over the HV region and the logic region, respectively; forming first and second overlying polysilicon layers with a spacer therebetween, an EG and a WL on the MCEL region formed; planarizing the second polysilicon layer down to upper surface of the plurality of CG stacks and the plurality of CG dummy stacks; and removing portions of the second polysilicon layer in-between the plurality of CG stacks and around the plurality of CG dummy stacks.

18 Claims, 3 Drawing Sheets

CONTROL GATE DUMMY FOR WORD LINE UNIFORMITY AND METHOD FOR PRODUCING THE SAME

TECHNICAL FIELD

The present disclosure relates to flash memory devices. The present disclosure is particularly applicable to flash memory devices for the 40 nanometer (nm) technologies node and beyond.

BACKGROUND

In integrated circuits (ICs), various devices such as a memory device and a logic device are configured to achieve a desired function. During fabrication of a memory device, e.g., an embedded third generation SuperFlash® (ESF3), and a logic device, the thickness of a gate electrode layer, e.g., a polysilicon layer, suitable for forming a word line (WL) of the memory device is non-uniform across the edge and center regions of the memory array region, e.g., a memory cell (MCEL) region. A portion of the gate electrode layer and gate stack at the edge of the memory array region is undesirably removed during chemical mechanical polishing (CMP) resulting in a sloped profile. Further, the thickness of the remaining gate electrode at the center region of the memory array region after an etch back (EB) process is non-uniform, e.g., the remaining gate electrode within the WL is lower than that at the edge of the memory array region, adversely impacting yield.

A need therefore exists for methodology enabling the formation of a uniform WL over the memory cell (MCEL) region.

SUMMARY

An aspect of the present disclosure is a method of forming a uniform WL over an MCEL region.

Another aspect of the present disclosure is a memory device with a uniform WL over an MCEL region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a substrate having a MCEL region, a high voltage (HV) region and a logic region, separated by an isolation region; forming a plurality of control gate (CG) stacks over the MCEL region, and a plurality of CG dummy stacks over the HV region and the logic region, respectively; forming first and second overlying polysilicon layers with a spacer therebetween, an erase gate (EG) and a WL on the MCEL region formed; planarizing the second polysilicon layer down to upper surface of the plurality of CG stacks and the plurality of CG dummy stacks; and removing portions of the second polysilicon layer in-between the plurality of CG stacks and around the plurality of CG dummy stacks.

Aspects of the present disclosure include forming the plurality of CG stacks and the plurality of CG dummy stacks by: forming an oxide layer over the Si substrate; forming a floating gate (FG) over the oxide layer; forming an interpoly dielectric (IPD) over the FG; forming a CG and a CG hardmask (HM), respectively, over the IPD; and forming a plurality of trenches through the CG HM, the CG, the IPD, the FG and the oxide layer. Further aspects include forming nitride and oxide spacers, respectively, on sidewalls of the plurality of CG stacks and the plurality of CG dummy stacks prior to forming the first and second polysilicon layers. Another aspect includes forming an EG over the MCEL region by: forming a source region in-between the CG stack in the MCEL region of the Si substrate by an N-type dopant implant; oxidizing an upper portion of the source region; forming nitride and oxide spacers on sidewalls of the CG stack; and forming polysilicon. Additional aspects include planarizing the second polysilicon layer by CMP. Further aspects include removing portions of the second polysilicon by a polysilicon EB process or reactive ion etching (ME). Another aspect includes forming the FG and CG of polysilicon. Additional aspects include forming the IPD of an oxide/nitride/oxide stack, and the CG HM of a nitride/oxide/nitride stack. Further aspects include the isolation region which includes a shallow trench isolation (STI), and wherein the STI includes: forming an oxide liner over the STI; and forming an insulating material over the oxide liner.

Another aspect of the present disclosure is a device including a substrate having a MCEL region, a HV region and a logic region, separated by an isolation region; a plurality of CG stacks over the MCEL region, and a plurality of CG dummy stacks over the HV region and the logic region with isolation region in-between; a first spacer and a second spacer on sidewalls of the plurality of CG stacks and the plurality of CG dummy stacks; an EG and a WL on the MCEL region; and a polysilicon layer within the EG, the WL and adjacent to the plurality of CG dummy stacks, wherein the polysilicon within the EG is coplanar with the polysilicon within the WL.

Aspects of the device include the EG which further includes: a source region in the MCEL region of the Si substrate; and a silicon oxide over the source region. Another aspect includes the polysilicon layer adjacent to the plurality of CG dummy stacks over the HV region and the logic region which includes a third spacer. Other aspects include the plurality of CG stacks and the plurality of CG dummy stacks which includes: an oxide layer over a portion of the Si substrate; a FG over the oxide layer; an IPD over the FG; and a CG and a CG HM, respectively, over the IPD. A further aspect includes the FG and CG which includes polysilicon; the IPD includes an oxide/nitride/oxide stack; and the CG HM includes a nitride/oxide/nitride stack. Additional aspects include the first spacer which includes nitride; and the second spacer which includes oxide. Another aspect includes the isolation region which includes an STI, and wherein the STI further includes an oxide liner over the STI; and an insulating material over the oxide liner.

A further aspect of the present disclosure is a method including: providing a silicon (Si) substrate having a MCEL region, a HV region and a logic region, respectively, separated by a STI; forming a plurality of CG stacks over the MCEL region, and a plurality CG dummy stacks over the HV region and the logic region, respectively; forming a first polysilicon layer over the Si substrate; forming a spacer over portions of the first polysilicon layer over the HV region and the logic region; forming a second polysilicon layer over the first polysilicon layer and the spacer, an EG and a WL on the MCEL region formed; planarizing the second polysilicon layer down to upper surface of the plurality of CG stacks and the plurality of CG dummy stacks by CMP; and removing portions of the second polysilicon layer in-between the plurality of CG stacks and adjacent to the plurality of CG dummy stacks by a polysilicon EB process or RIE.

Aspects of the present disclosure include forming the plurality of CG stacks and the plurality of CG dummy stacks by: forming an oxide layer over the Si substrate; forming a FG over the oxide layer; forming an IPD over the FG; forming a CG and a CG HM, respectively, over the IPD; and forming a plurality of trenches through the CG HM, the CG, the IPD, the FG and the oxide layer. Another aspect includes forming an EG over the MCEL region by: forming a source region in the MCEL region of the Si substrate by an N-type dopant implant; and oxidizing an upper portion of the source region. A further aspect includes forming nitride and oxide spacers on sidewalls of the plurality of CG stacks and the plurality of CG dummy gate stacks prior to forming the first and second polysilicon layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of thin and/or non-uniform WL polysilicon layers above the MCEL region attendant upon forming an embedded ESF3 SuperFlash memory cell. This problem is solved, inter alia, by forming a CG dummy stack over the HV and logic region before the CMP and polysilicon EB processing steps.

Methodology in accordance with embodiments of the present disclosure includes providing a substrate having a MCEL region, a HV region and a logic region, separated by an isolation region. A plurality of CG stacks is formed over the MCEL region, and a plurality of CG dummy stacks is formed over the HV region and the logic region, respectively. A first and second overlying polysilicon layers are formed with a spacer therebetween, an EG and a WL on the MCEL region formed. The second polysilicon layer is planarized down to upper surface of the plurality of CG stacks and the plurality of CG dummy stacks, and portions of the second polysilicon layer in-between the plurality of CG stacks and around the plurality of CG dummy stacks is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
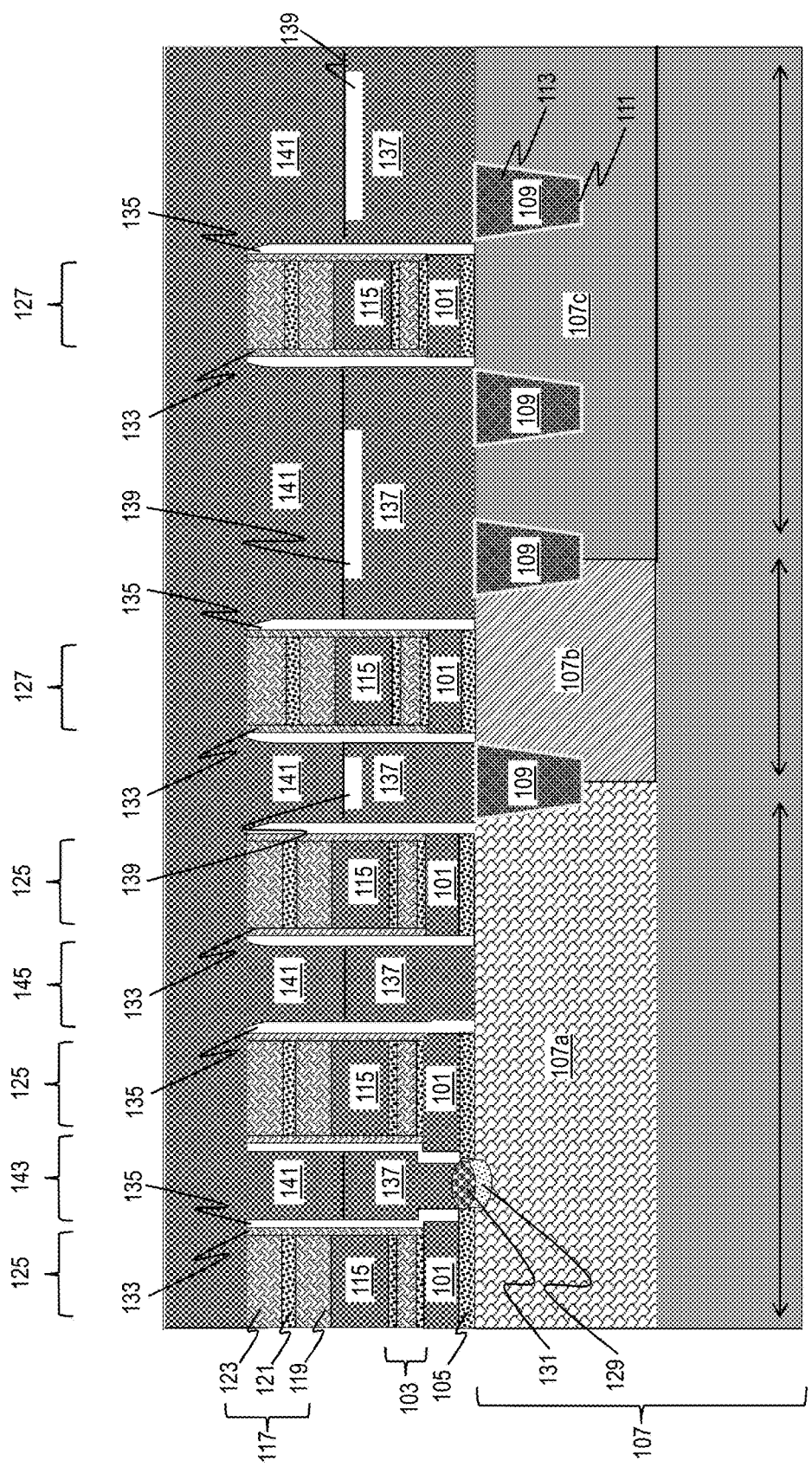
FIGS. 1 through 3 schematically illustrate a process flow for forming a CG dummy stack for a uniform WL polysilicon, in accordance with an exemplary embodiment.
Figure 2:
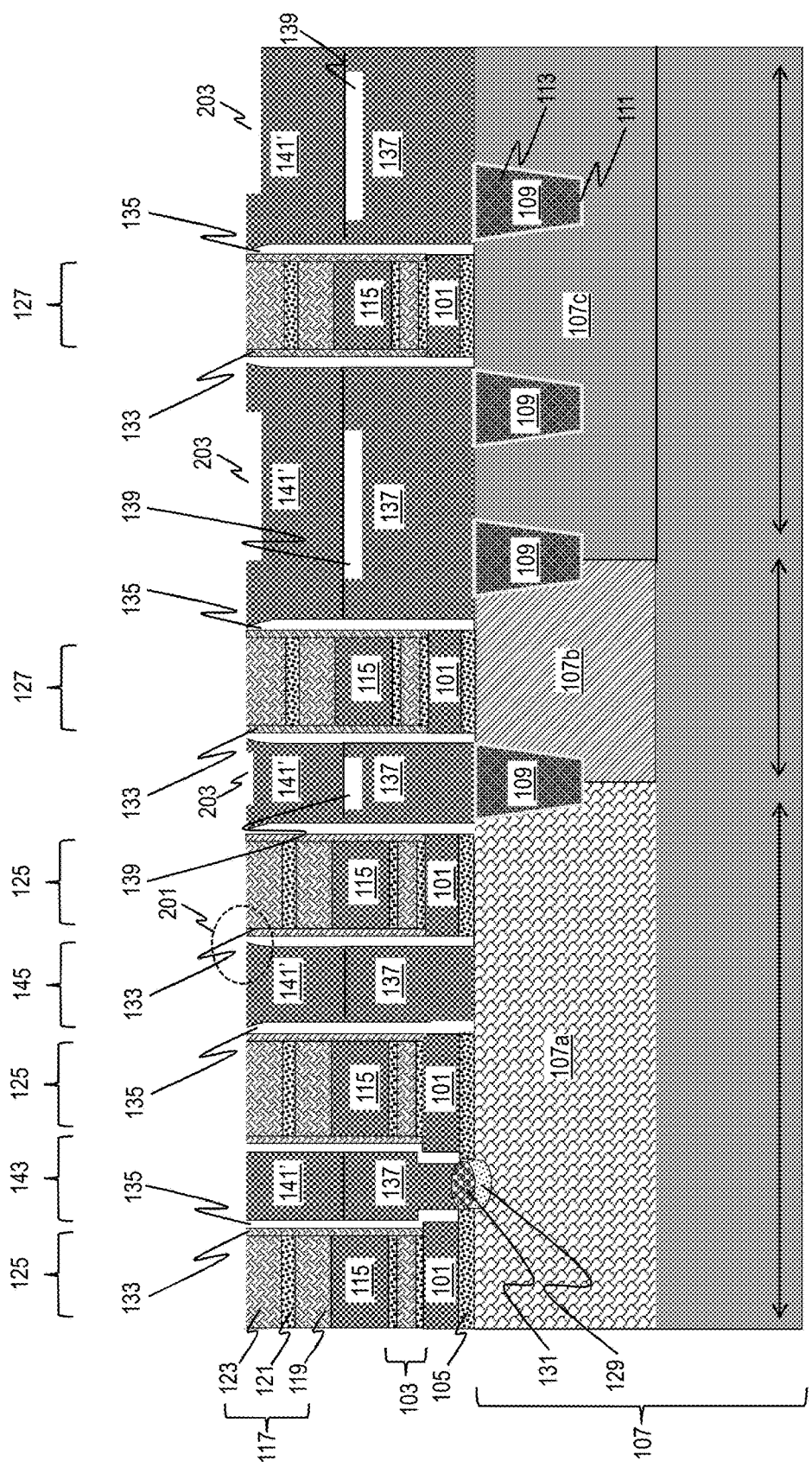
Figure 3:
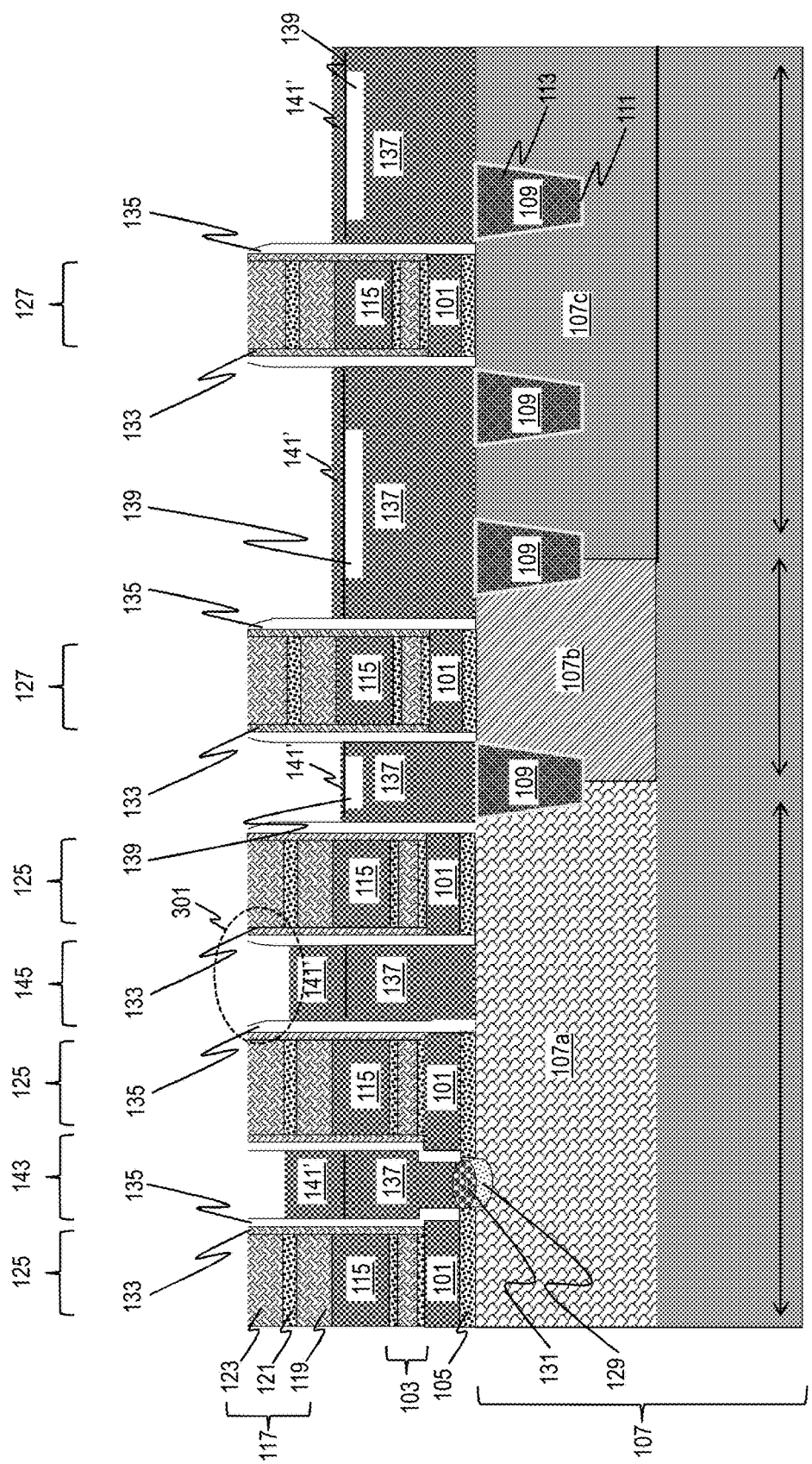

FIGS. 1 through 3 schematically illustrate a process flow for forming a CG dummy stack for uniform WL polysilicon, in accordance with an exemplary embodiment. Referring to FIG. 1, a FG 101 and an IPD 103 are formed on an oxide layer 105 over a Si substrate 107 that includes a MCEL region 107a, a HV region 107b and a logic region 107c, each separated by an STI region 109 including an oxide layer 111 and insulating material 113. In one instance, the FG 101 may be formed, e.g., of polysilicon or the like materials, and the IPD 103 may be formed, e.g., of an oxide/nitride/oxide stack or the stack of like materials, each layer having a thickness, e.g., of 5 nanometers (nm) to 6 (nm). In another instance, the logic region 107c includes low voltage (LV). Then, a CG 115 is formed, e.g., of polysilicon or the like materials, to a thickness, e.g., of 40 nm to 50 nm, and a CG HM 117 is formed over the CG 115. The CG HM 117 may be formed, e.g., of a nitride layer 119, an oxide layer 121, and a nitride layer 123 stack or the stack of like materials. In this instance, the nitride layers 119 and 123 are formed to a thickness, e.g., of 30 nm to 40 nm, and the oxide layer 121 is formed to a thickness, e.g., of 9 nm to 10 nm.

Next, a series of trenches (not shown for illustrative convenience) are formed through the CG HM 117, CG 115, IPD 103, the FG 101 and the oxide layer 105 down to the Si substrate 107, forming CG stacks 125 over the MCEL region 107a, and CG dummy stacks 127 over the HV region 107b and the logic region 107c. Thereafter, a source region 129 is formed in the MCEL region 107a, e.g., by an N-type dopant implant. The upper portion 131 of the source region 129 is then oxidized resulting in silicon oxide. The growth of the silicon oxide is accelerated due to the high N-type dopant implant. Next, nitride spacers 133 and oxide spacers 135 are respectively formed on the sidewalls of the CG stacks 125 and CG dummy stacks 127. The nitride spacers 133 are each formed, e.g., to a thickness of 5 nm to 6 nm, and the oxide spacers 135 are each formed, e.g., to a thickness of 20 nm to 30 nm. Thereafter, a portion of the trenches are filled with polysilicon layer 137. Next, spacers 139 are formed, e.g., to a thickness of 40 nm to 60 nm, in portions of the polysilicon layer 137 over the HV region 107b and the logic region 107c. Subsequently, polysilicon layer 141 is conformally formed over the CG stacks 125, CG dummy stacks 127, polysilicon layer 137 and spacers 139, forming polysilicon EG 143 and the WL polysilicon 145.

As illustrated in FIG. 2, the polysilicon layer 141 is then planarized down to the upper surface of the CG stacks 125 and CG dummy stacks 127 by CMP, forming polysilicon layer 141' with uniform thickness and a reduced dishing area 203. The CG dummy stacks 127 formed adjacent to the edge of the array region 201 protects at least the polysilicon layer 141 and the CG stack 125 at the edge region of the array region 201 from being removed during the CMP process. As a result, the thickness of the remaining polysilicon layer 141 after the CMP process is uniform and substantially coplanar.

Thereafter, portions of the polysilicon layer 141' within EG 143 and the WL polysilicon 145, and in-between and adjacent to the CG dummy stacks 127 is removed, e.g., by a polysilicon EB process, as depicted in FIG. 3. As discussed above, the polysilicon layer 141 and the CG stack 125 at the edge region of the array region 201 is not eroded, and the remaining polysilicon layer 141' is sufficiently thick to allow, for example, a polysilicon EB process to properly define and form a uniform WL polysilicon 145', as represented by 301.

The embodiments of the present disclosure can achieve several technical effects, such as improved WL polysilicon uniformity, improved voltage, avoiding the cost and complexity of additional masking processes. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including flash memory devices for the 40 nm technologies node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a substrate having a memory cell (MCEL) region, a high voltage (HV) region and a logic region, separated by an isolation region;
    forming a plurality of control gate (CG) stacks over the MCEL region, and a plurality of CG dummy stacks over the HV region and the logic region, respectively;
    forming first and second overlying polysilicon layers with a spacer therebetween, an erase gate (EG) and a word line (WL) on the MCEL region formed, wherein forming the EG on the MCEL region comprises:
        forming a source region in the MCEL region of the Si substrate by an N-type dopant implant; and
        oxidizing an upper portion of the source region;
    planarizing the second polysilicon layer down to upper surface of the plurality of CG stacks and the plurality of CG dummy stacks; and
    removing portions of the second polysilicon layer in-between the plurality of CG stacks and around the plurality of CG dummy stacks.

2. The method according to claim 1, comprising forming the plurality of CG stacks and the plurality of CG dummy stacks by:
    forming an oxide layer over the Si substrate;
    forming a floating gate (FG) over the oxide layer;
    forming an interpoly dielectric (IPD) over the FG;
    forming a control gate (CG) and a CG hardmask (HM), respectively, over the IPD; and
    forming a plurality of trenches through the CG HM, the CG, the IPD, the FG and the oxide layer.

3. The method according to claim 1, comprising planarizing the second polysilicon layer by chemical mechanical polishing (CMP).

4. The method according to claim 1, comprising removing portions of the second polysilicon by a polysilicon etch back (EB) process or reactive ion etching (RIE).

5. The method according to claim 1, wherein the isolation region comprises a shallow trench isolation (STI), and wherein the STI further comprising:
    forming an oxide liner over the STI; and
    forming an insulating material over the oxide liner.

6. The method according to claim 2, further comprising:
    forming nitride and oxide spacers, respectively, on sidewalls of the plurality of CG stacks and the plurality of CG dummy stacks prior to forming the first and second polysilicon layers.

7. The method according to claim 2, further comprising forming the EG on the MCEL region by:
    forming nitride and oxide spacers on sidewalls of the CG stack; and
    forming polysilicon.

8. The method according to claim 2, comprising forming the FG and CG of polysilicon.

9. The method according to claim 2, comprising forming the IPD of an oxide/nitride/oxide stack, and the CG HM of a nitride/oxide/nitride stack.

10. A device comprising:
    a substrate having a memory cell (MCEL) region, a high voltage (HV) region and a logic region, separated by an isolation region;
    a plurality of control gate (CG) stacks over the MCEL region, and a plurality of CG dummy stacks over the HV region and the logic region with isolation region in-between;
    a first spacer and a second spacer on sidewalls of the plurality of CG stacks and the plurality of CG dummy stacks;
    an erase gate (EG) and a word line (WL) on the MCEL region, wherein the EG further comprises:
        a source region in the MCEL region of the Si substrate; and
        a silicon oxide over the source region; and
    a polysilicon layer within the EG, the WL and adjacent to the plurality of CG dummy stacks, wherein the polysilicon within the EG is coplanar with the polysilicon within the WL.

11. The device according to claim 10, wherein the polysilicon layer adjacent to the plurality of CG dummy stacks over the HV region and the logic region comprises a third spacer.

12. The device according to claim 10, wherein the plurality of CG stacks and the plurality of CG dummy stacks comprises:
    an oxide layer over a portion of the Si substrate;
    a floating gate (FG) over the oxide layer;
    an interpoly dielectric (IPD) over the FG; and
    a control gate (CG) and a CG hardmask (HM), respectively, over the IPD.

13. The device according to claim 10, wherein:
    the first spacer comprises nitride; and
    the second spacer comprises oxide.

14. The device according to claim 10, wherein the isolation region comprises a shallow trench isolation (STI), and wherein the STI further comprises:
   an oxide liner over the STI; and
   an insulating material over the oxide liner.

15. The device according to claim 11, wherein:
   the FG and CG comprise polysilicon;
   the IPD comprises an oxide/nitride/oxide stack; and
   the CG HM comprises a nitride/oxide/nitride stack.

16. A method comprising:
   providing a silicon (Si) substrate having a memory cell (MCEL) region, a high voltage (HV) region and a logic region, respectively, separated by a shallow trench isolation (STI);
   forming a plurality of control gate (CG) stacks over the MCEL region, and a plurality of CG dummy stacks over the HV region and the logic region, respectively;
   forming a first polysilicon layer over the Si substrate;
   forming a spacer over portions of the first polysilicon layer over the HV region and the logic region;
   forming a second polysilicon layer over the first polysilicon layer and the spacer, an erase gate (EG) and a word line (WL) on the MCEL region formed, wherein forming the EG on the MCEL region comprises:
      forming a source region in the MCEL region of the Si substrate by an N-type dopant implant; and
      oxidizing an upper portion of the source region;
   planarizing the second polysilicon layer down to upper surface of the plurality of CG stacks and the plurality of CG dummy stacks by chemical mechanical polishing (CMP); and
   removing portions of the second polysilicon layer in-between the plurality of CG stacks and adjacent to the plurality of CG dummy stacks by a polysilicon etch back (EB) process or reactive ion etching (RIE).

17. The method according to claim 16, comprising forming the plurality of CG stacks and the plurality of CG dummy stacks by:
   forming an oxide layer over the Si substrate;
   forming a floating gate (FG) over the oxide layer;
   forming an interpoly dielectric (IPD) over the FG;
   forming a control gate (CG) and a CG hardmask (HM), respectively, over the IPD; and
   forming a plurality of trenches through the CG HM, the CG, the IPD, the FG and the oxide layer.

18. The method according to claim 16, further comprising:
   forming nitride and oxide spacers on sidewalls of the plurality of CG stacks and the plurality of CG dummy gate stacks prior to forming the first and second polysilicon layers.

* * * * *